United States Patent
Ogawa et al.

(10) Patent No.: US 9,642,267 B2
(45) Date of Patent: May 2, 2017

(54) PORTABLE WIRELESS DEVICE

(75) Inventors: Kenji Ogawa, Osaka (JP); Yoshio Koyanagi, Kanagawa (JP); Kouta Aoki, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 462 days.

(21) Appl. No.: 13/985,353

(22) PCT Filed: Feb. 16, 2012

(86) PCT No.: PCT/JP2012/001039
§ 371 (c)(1),
(2), (4) Date: Aug. 14, 2013

(87) PCT Pub. No.: WO2012/114690
PCT Pub. Date: Aug. 30, 2012

(65) Prior Publication Data
US 2013/0322038 A1   Dec. 5, 2013

(30) Foreign Application Priority Data

Feb. 25, 2011   (JP) .................................. 2011-040671

(51) Int. Cl.
*H05K 5/00* (2006.01)
*H01Q 9/40* (2006.01)
(Continued)

(52) U.S. Cl.
CPC ........... *H05K 5/0086* (2013.01); *H01Q 1/243* (2013.01); *H01Q 5/378* (2015.01); *H01Q 9/40* (2013.01); *H01Q 9/42* (2013.01)

(58) Field of Classification Search
CPC .............................. H05K 5/0086; H01Q 5/378
(Continued)

(56) References Cited

U.S. PATENT DOCUMENTS

2004/0227675 A1   11/2004   Harano
2007/0146213 A1   6/2007   Soekawa et al.
(Continued)

FOREIGN PATENT DOCUMENTS

JP        06-334420 A    12/1994
JP     2004-064282 A     2/2004
(Continued)

OTHER PUBLICATIONS

International Search Report, mailed Apr. 24, 2012, for PCT/JP2012/001039, 4 pages.

*Primary Examiner* — Dameon E Levi
*Assistant Examiner* — Walter Davis
(74) *Attorney, Agent, or Firm* — Seed IP Law Group LLP (57) ABSTRACT

An antenna includes two elements having an antenna element which resonates by a frequency f1 and a ground wire element which resonates by a frequency f2 higher than the frequency f1. The antenna element is directed so that an antenna radiation part is located to be substantially parallel to a surface of a casing on which an operating part is provided. The ground wire element is directed so that a ground wire radiation part is located substantially vertically to the surface of the casing on which the operating part is provided. Further, a space between a feeding terminal connecting part of the antenna element and a ground terminal connecting part of the ground wire element is set to be equal to a space between a feeding terminal and a ground terminal and the feeding terminal connecting part is arranged to be parallel to the ground terminal connecting part.

11 Claims, 12 Drawing Sheets

(51) Int. Cl.
*H01Q 9/42* (2006.01)
*H01Q 1/24* (2006.01)
*H01Q 5/378* (2015.01)

(58) Field of Classification Search
USPC ........................................................ 343/702
See application file for complete search history.

(56) References Cited

U.S. PATENT DOCUMENTS

| | | |
|---|---|---|
| 2008/0007468 A1 | 1/2008 | Sato et al. |
| 2009/0179815 A1 | 7/2009 | Sotoma et al. |
| 2009/0233657 A1* | 9/2009 | Ogawa .................. H01Q 1/243 455/575.3 |
| 2010/0026602 A1 | 2/2010 | Hotta et al. |
| 2010/0214174 A1 | 8/2010 | Guan et al. |
| 2010/0283704 A1 | 11/2010 | Hotta et al. |
| 2012/0212912 A1* | 8/2012 | Tanaka .................. H01Q 1/52 361/749 |

FOREIGN PATENT DOCUMENTS

| | | |
|---|---|---|
| JP | 2004-128660 A | 4/2004 |
| JP | 2004-260434 A | 9/2004 |
| JP | 2007-181076 A | 7/2007 |
| JP | 2007-202040 A | 8/2007 |
| JP | 2008-17352 A | 1/2008 |
| JP | 2008-072204 A | 3/2008 |
| JP | 2008-072486 A | 3/2008 |
| JP | 2009-171096 A | 7/2009 |
| JP | 2010-034906 A | 2/2010 |
| JP | 2010-199876 A | 9/2010 |
| JP | 2010-232820 A | 10/2010 |

* cited by examiner

FIRST FREQUENCY f1 (EXCITATION OF ANTENNA)

FIG. 3B

SECOND FREQUENCY f2 (EXCITATION OF GROUND WIRE)

FIG. 3C

FIRST FREQUENCY f1 (EXCITATION OF ANTENNA)

FIG. 3D

SECOND FREQUENCY f2 (EXCITATION OF GROUND WIRE)

PORTABLE WIRELESS DEVICE

TECHNICAL FIELD

The present invention relates to a portable wireless device provided with an antenna element and a ground wire element.

BACKGROUND ART

As a portable wireless device having an antenna element and a ground wire element, for instance, portable wireless devices disclosed in, for instance, patent literatures 1 to 5 are known. The antenna element and the ground wire element are frequently arranged in an upper part of a casing of the portable wireless device. However, in a straight type portable wireless device represented by a smart phone which is recently popularized, the antenna element and the ground wire element are ordinarily arranged not in the upper part of the casing which comes close to the head part of a human body, but in a lower part of the casing separated from the head part of the human body from the viewpoint of a design on SAR (Specific Absorption Rate). The SAR means energy absorbed by a system of a unit mass in a unit time.

LITERATURE OF RELATED ART

Patent Literature

Patent Literature 1: JP-A-2008-072486
Patent Literature 2: JP-A-2004-260434
Patent Literature 3: JP-A-2007-202040
Patent Literature 4: JP-A-2008-017352
Patent Literature 5: JP-A-6-334420

SUMMARY OF THE INVENTION

Problems that the Invention is to Solve

However, in the straight type portable wireless device such as the smart phone, when the antenna is arranged in the lower part of the casing, there is a fear that a gain is seriously deteriorated due to a covering of the antenna with a hand of a person during an actual use such as speaking. As main factors of the deterioration of the gain, below-described situations may be exemplified. Namely, a transmission electric power radiated from the antenna is absorbed by the hand in the near-field of a portable wireless device main body, and an electric current induced in the hand from the antenna and an electric current supplied to the antenna are cancelled each other. Techniques disclosed in the above-described patent literatures 3, 4 and 5 have a problem to achieve a high gain when the devices are held by hand. Further, techniques disclosed in the patent literatures 1 and 2 have a problem to achieve a wide band due to a structure of single resonance.

The present invention is devised by considering the above-described circumstances and it is an object of the present invention to provide a portable wireless device including an antenna element and a ground wire element in which a wide band and a high gain during holding the device by hand can be compatibly achieved.

Means for Solving the Problems

According to one aspect of the invention, there is provided a portable wireless device including:
a casing;
an operating part provided on the casing;
a circuit board provided in the casing and having a ground and a radio circuit;
an antenna element provided in the casing and arranged so as to be spaced with a prescribed distance from the ground on the circuit board;
a ground wire element provided in the casing and arranged so as to be spaced with a prescribed distance from the ground on the circuit board;
a feeding terminal connected to the radio circuit on the circuit board and the antenna element; and
a ground terminal connected to the ground on the circuit board and the ground wire element, wherein
the antenna element is configured to resonate by a first frequency,
the ground wire element is configured to resonate by a second frequency higher than the first frequency,
the feeding terminal and the ground wire element are close to each other,
the antenna element and the ground wire element have a parallel part in the vicinity of the feeding terminal and the ground terminal, and
the ground wire element has a part more separated from the operating part than at least the antenna element in a direction of thickness of the casing.

According to the above-described structure, the antenna element is connected to the ground wire element in the vicinity of a feeder part. Thus, an antenna current supplied to the ground wire element when the portable wireless device is held by hand is induced and dispersed to the antenna element separated from the palm of the hand. Accordingly, the antenna current is hardly induced to the hand. Thus, a deterioration of a gain is reduced in the second frequency when the portable wireless device is held by hand. Further, since the ground wire element is provided between the antenna element and the palm of the hand, the ground wire element serves as a role of a shield. When the portable wireless device is held by hand, the deterioration of the gain is reduced in the first frequency. Accordingly, a wide band and a high gain at the time of holding the portable wireless device by hand are compatibly achieved.

In a portable wireless device according to the above, a space between the feeding terminal and the ground terminal may be as narrow as 0.1λ or shorter at the second frequency.

According to the above-described structure, when the portable wireless device is held by hand, an antenna current in the second frequency can be induced to the antenna element from the ground wire element.

In a portable wireless device according to the above, the ground wire element may have a part more separated from the operating part than at least the parallel part of the antenna element and the ground wire element in a direction of thickness of the casing.

According to the above-described structure, when the portable wireless device is held by hand, since the parallel part is separated from the hand, the gain can be more improved when the device is held by hand.

In a portable wireless device according to the above, the antenna element and the ground wire element may be formed in the shapes of plates.

According to the above-described structure, since the antenna element and the ground wire element are respectively formed in the shapes of plates, an occupied volume as an antenna can be reduced.

In a portable wireless device according to the above, the parallel part of the antenna element and the ground wire element may be arranged in parallel with the direction of thickness of the casing.

According to the above-described structure, since the parallel part of the antenna element and the ground wire element is arranged in parallel with the direction of thickness of the casing, when the portable wireless device is held by hand, an interference area with the palm of the hand can be reduced and the gain can be more improved when the device is held by hand.

In a portable wireless device according to the above, surfaces of the antenna element and the ground wire element may substantially intersect at right angles except the parallel part thereof.

According to the above-described structure, interference between the antenna element and the ground wire element in the vicinity of ends of the antenna element and the ground wire element, which causes a deterioration of a band, can be suppressed, so that a wide band can be obtained.

In a portable wireless device according to the above, the ground wire element may be arranged so that a ground wire radiation part thereof is located to be substantially parallel to a surface of the casing on which the operating part is provided.

According to the above-described structure, since the ground wire element is arranged between the antenna element and the palm of the hand when the portable wireless device is held by hand, interference between the antenna element and the palm of the hand can be suppressed.

In a portable wireless device according to the above, an antenna radiation part of the antenna element and a ground wire radiation part of the ground wire element may be parallel to each other.

According to the above-described structure, since the antenna element is strongly connected to the ground wire element, the deterioration of the gain can be more suppressed when the portable wireless device is held by hand.

In a portable wireless device according to the above, the antenna element and the ground wire element may be respectively arranged so as to have directions opposite to each other except the parallel part of the antenna element and the ground wire element.

According to the above-described structure, a degree of freedom in arrangement of the ground wire element is improved, so that a distance between the ground wire element and the palm of the hand can be ensured.

In a portable wireless device according to the above, the antenna element may be formed to have a plurality of planes.

According to the above-described structure, the wide band in the first frequency can be obtained.

In a portable wireless device according to the above, the ground wire element may be formed to have a plurality of planes.

According to the above-described structure, the wide band in the second frequency can be obtained.

In a portable wireless device according to the above, the antenna element may be formed to have a plurality of antenna radiation parts.

According to the above-described structure, multi-resonance can be obtained more.

Advantage of the Invention

According to the present invention, a wide band and a high gain at the time of holding a device by hand can be compatibly achieved in a portable wireless device having an antenna element and a ground wire element.

MODE FOR CARRYING OUT THE INVENTION

Now, a preferred exemplary embodiment for carrying out the present invention will be described below in detail by referring to the drawings.

Figure 1:
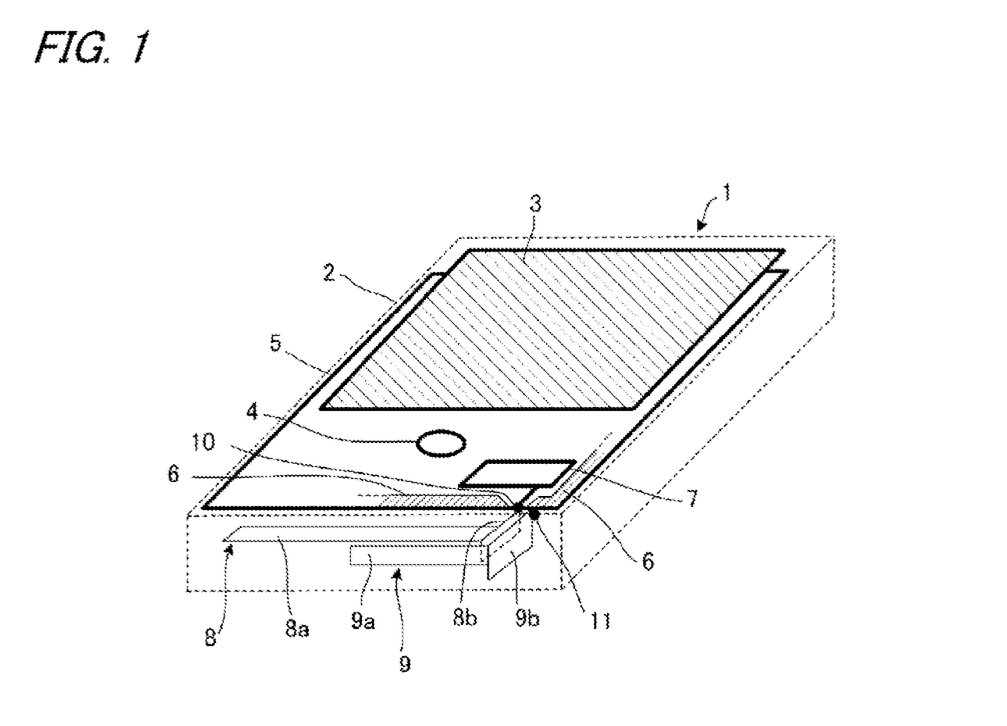
FIG. 1 is a perspective view showing a general appearance including a part of an inner structure of a portable wireless device according to one exemplary embodiment of the present invention.
Figure 2:
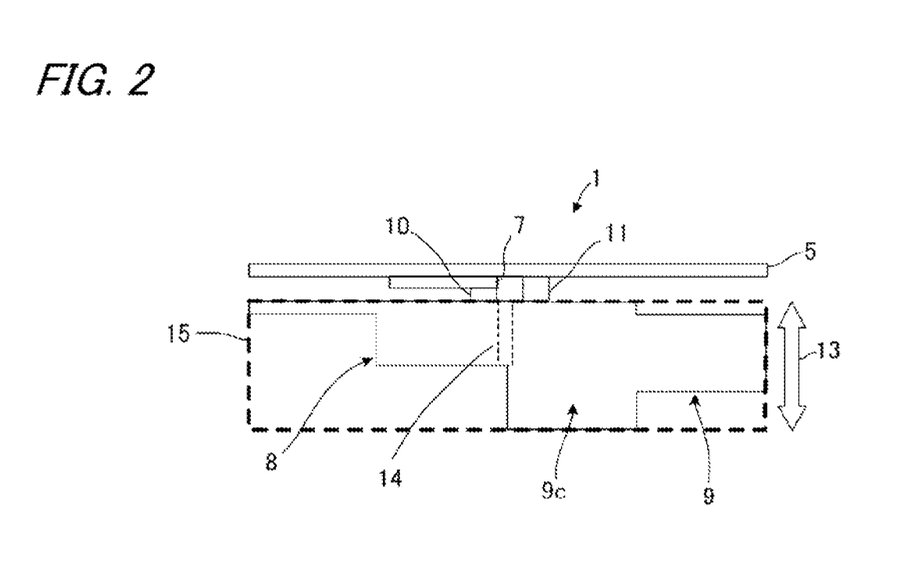
FIG. 2 is a schematic view showing an outline of a positional relation of members respectively in the direction of thickness of a casing of the portable wireless device shown in FIG. 1.

FIG. 1 is a perspective view showing a general appearance including a part of an inner structure of a portable wireless device according to one exemplary embodiment of the present invention. FIG. 2 is a schematic view showing an outline of a positional relation of members respectively in the direction of thickness of a casing of the portable wireless device shown in FIG. 1. In FIG. 1 and FIG. 2, the portable wireless device 1 of the present exemplary embodiment is a straight type portable wireless device called a smart phone.

The portable wireless device 1 includes a casing 2 formed in a thin square shape, an operating and display part 3 provided in a front surface side of the casing 2, an operating part 4 provided in the front surface side of the casing 2 and at a position separated from the operating and display part 3, a circuit board 5 provided in the casing 2 and having a ground 6 and a radio circuit 7, an antenna element 8 provided in the casing 2 and arranged to be spaced by a prescribed distance from the ground 6 on the circuit board 5, a ground wire element 9 provided in the casing 2 and arranged to be spaced by a prescribed distance from the ground 6 on the circuit board 5, a feeding terminal 10 connected to the radio circuit 7 on the circuit board 5 and the antenna element 8 and a ground terminal 11 connected to the ground 6 on the circuit board 5 and the ground wire element 9.

The operating and display part 3 includes a display (an illustration is omitted) such as a liquid crystal or an organic EL (Organic Electro-Luminescence) and a touch panel (an illustration is omitted) arranged just above a display surface of the display to output a coordinate corresponding to a position touched by a hand or a finger of a user as coordinate information. The operating part 4 is formed with a button switch.

The antenna element 8 includes an antenna radiation part 8a having a length of 39 mm and a width of 4 mm and a feeding terminal connecting part 8b having a length of 8 mm and a width of 2 mm. The antenna radiation part 8a as a main body part is formed in the shape of a rectangular plate. The feeding terminal connecting part 8b as a part of one end side of the antenna radiation part 8a is formed in an orthogonal direction or in a direction intersecting at right angles to the antenna radiation part 8a. The feeding terminal connecting part 8b is formed in the shape of a rectangular plate like the antenna radiation part 8a. In this case, a resonance frequency of the antenna element 8 is 1.6 GHz. The ground wire element 9 includes a ground wire radiation part 9a having a length of 12 mm and a width of 2 mm and a ground terminal connecting part 9b having a length of 10 mm and a width of 5 mm. The ground wire radiation part 9a as a main body part is formed in the shape of a rectangular plate. The ground terminal connecting part 9b as a part of one end side of the ground wire radiation part 9a is formed in an orthogonal direction or in a direction intersecting at right angles to the ground wire radiation part 9a. The ground terminal connecting part 9b is formed in a rectangular shape and has a width larger than that of the ground wire radiation part 9a. A width of the ground terminal connecting part 9b of the ground wire element 9 is larger than a width of the feeding terminal connecting part 8b of the antenna terminal 8. In this case, a resonance frequency of the ground wire element 9 is 2.2 GHz. Accordingly, since the ground wire 9 is allowed to resonate by a second frequency f2 higher than a first frequency f1 as the resonance frequency of the antenna element 8, the ground wire element 9 is formed to be shorter than the antenna element 8.

The antenna element 8 is arranged so that the antenna radiation part 8a is located substantially in parallel with the surface of the casing 2 on which the operating part 4 is provided. The ground wire element 9 is arranged so that the ground wire radiation part 9a is located substantially vertically to the surface of the casing 2 on which the operating part 4 is provided. Further, the antenna element 8 and the ground wire element 9 are arranged so that a space between the feeding terminal connecting part 8b and the ground terminal connecting part 9b is equal to a space between a feeding terminal 10 and a ground terminal 11 and the feeding terminal connecting part 8b is parallel to the ground terminal connecting part 9b. The space between the feeding terminal 10 and the ground terminal 11 is 2 mm, which is as narrow as 0.1λ or shorter at the second frequency f2. With this space, when the portable wireless device 1 is held by hand, an antenna current in the second frequency f2 can be induced to the antenna element 8 from the ground wire element 9.

Further, in a positional relation between the antenna element 8 and the ground wire element 9, the antenna element 8 and the ground wire element 9 are arranged in order in a direction separating from the surface of the casing 2 on which the operating part 4 is provided. Namely, as an arrangement order in a direction of thickness 13 (see FIG. 2) of the casing 2, the surface of the casing 2 on which the operating part 4 is provided, the antenna element 8 and the ground wire element 9 are arranged in order. In this case, as described above, since the width of the ground terminal connecting part 9b of the ground wire element 9 is larger than the width of the feeding terminal connecting part 8b of the antenna terminal 8, the ground wire element 9 has a part 9c which is more separated from the operating part 4 than the antenna element 8 in the direction of thickness 13 of the casing 2. Further, a part shown by reference numeral 14 in FIG. 2 is a part in which the feeding connecting part 8b of the antenna element 8 and the ground terminal connecting part 9b of the ground wire element 9 are parallel to each other. An area shown by reference numeral 15 in FIG. 2 is an antenna mounting area.

Since the antenna element 8 and the ground wire element 9 are formed in the shapes of the plates, an occupied volume as an antenna can be reduce. Further, since the ground wire element 9 is provided with the part 9c extended in the direction of thickness 13 of the casing 2, when the portable wireless device 1 is held by hand, the part 9c is arranged nearer to the palm of the hand than the antenna element 8. Thus, interference between the antenna element 8 and the palm of the hand can be suppressed and the parallel part 14 can be separated from the hand. Accordingly, a gain can be more improved when the portable wireless device is held by hand. Further, since the parallel part 14 of the antenna element 8 and the ground wire element 9 is arranged in parallel with the direction of thickness of the casing 2, when the portable wireless device 1 is held by hand, an interference area between the palm of the hand and the portable wireless device can be reduced to more improve the gain when the portable wireless device is held by hand. Further, the feeding terminal connecting part 8b of the antenna element 8 and the ground terminal connecting part 9b of the ground wire element 9 are respectively substantially orthogonal to the surface of the casing 2 on which the operating part 4 is provided. Thus, interference between the antenna element 8 and the ground wire element 9 in the vicinity of ends of the antenna element 8 and the ground wire element 9, which causes a deterioration of a band, can be suppressed so that a wide band may be obtained.

Figure 3A:
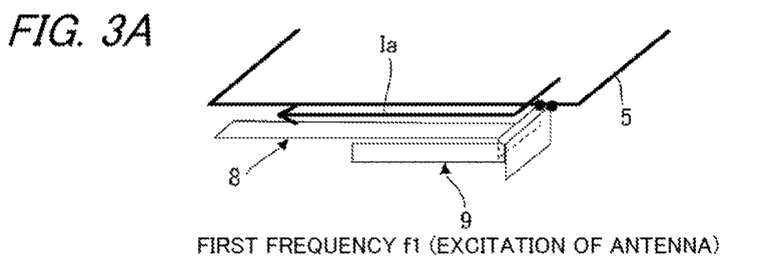
FIGS. 3A to 3D are perspective views for explaining paths of an antenna current in the portable wireless device shown in FIG. 1.
Figure 3B:
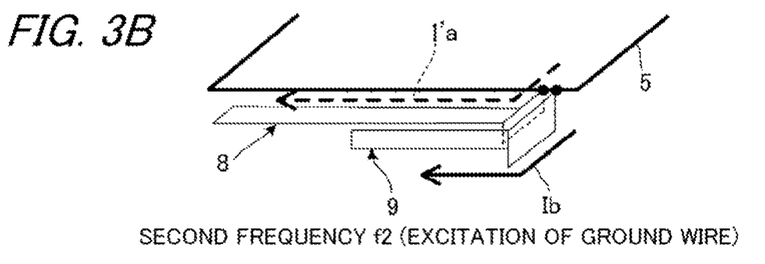
Figure 3C:
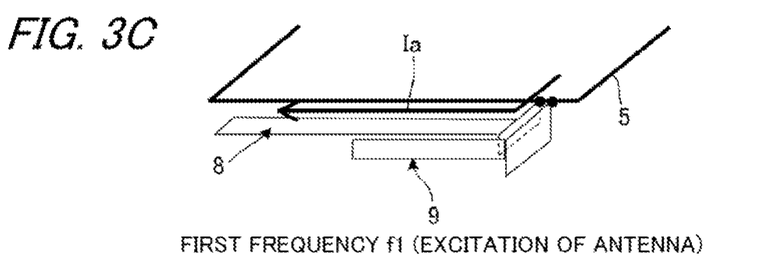
Figure 3D:
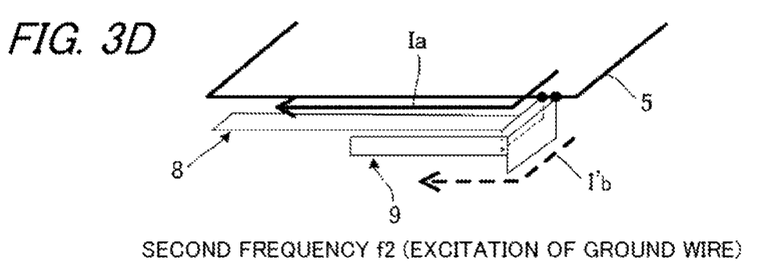

FIGS. 3A to 3D are perspective views for explaining paths of an antenna current in the portable wireless device 1 of the present exemplary embodiment. FIG. 3A shows the path of the antenna current when the portable wireless device 1 is not held by hand and an excitation is carried out by a high frequency signal of the first frequency f1. In this case, the antenna element 8 is excited so that the antenna current Ia is supplied only to the antenna element 8. FIG. 3B shows the path of the antenna current when the portable wireless device 1 is not held by hand and an excitation is carried out by a high frequency signal of the second frequency f2. In this case, the ground wire element 9 is excited so that the antenna current Ib is supplied to the ground wire element 9, and the antenna current Ia' is slightly supplied to the antenna element 8. FIG. 3C shows the path of the antenna current when the portable wireless device 1 is held by hand and an excitation is carried out by a high frequency signal of the first frequency f1. In this case, the antenna element 8 is excited so that the antenna current Ia is supplied only to the antenna element 8. FIG. 3D shows the path of the antenna current when the portable wireless device 1 is held by hand and an excitation is carried out by a high frequency signal of the second frequency f2. In this case, the antenna element 8 is excited so that the antenna current Ia is supplied to the antenna element 8, and the antenna current Ib is slightly supplied to the ground wire element 9. As apparent from FIGS. 3B and 3D, when the portable wireless device is held by hand, the antenna current is induced and dispersed to the antenna element 8.

As described above, according to the portable wireless device 1 of the present exemplary embodiment, the antenna element 8 which resonates by the first frequency f1 is directed so that the antenna radiation part 8a is located to be parallel to the surface of the casing 2 on which the operating part 4 is provided. The ground wire element 9 which resonates by the second frequency f2 higher than the first frequency f1 is directed so that the ground wire radiation part 9a is located vertically to the surface of the casing 2 on which the operating part 4 is provided. Further, the space between the feeding terminal connecting part 8b of the antenna element 8 and the ground terminal connecting part 9b of the ground wire element 9 is set to be equal to the space (as narrow as 0.1λ or shorter at the second frequency f2) between the feeding terminal 10 and the ground terminal 11 and the feeding terminal connecting part 8b is arranged to be parallel to the ground terminal connecting part 9b.

Accordingly, the antenna element 8 is connected to the ground wire element 9 in the vicinity of a feeder part (a part where the feeding terminal 10 and the ground terminal 11 are provided). Thus, when the portable wireless device 1 is held by hand while carrying out the excitation by the high frequency signal of the second frequency f2, the antenna current supplied to the ground wire element 9 is induced and dispersed to the antenna element 8 from the palm of the hand. Accordingly, the antenna current is hardly induced to the hand to reduce a deterioration of the gain. Further, since the ground wire element 9 is provided between the antenna element 8 and the palm of the hand, the ground wire element 9 serves as a role of a shield. When the portable wireless device 1 is held by hand while carrying out the excitation by the signal of the first frequency f1, the deterioration of the gain is reduced. Accordingly, an antenna structure can be realized which makes it possible to compatibly achieve a wide band and a high gain at the time of holding the portable wireless device by hand.

In the present exemplary embodiment, the antenna element 8 is arranged so that the antenna radiation part 8a is located substantially in parallel with the surface of the casing 2 on which the operating part 4 is provided. The ground wire element 9 is arranged so that the ground wire radiation part 9a is located substantially vertically to the surface of the casing 2 on which the operating part 4 is provided. However, as directions of the antenna element 8 and the ground wire element 9 respectively relative to an operating surface of the casing 2, various modified examples are considered.

Further, in the present exemplary embodiment, the antenna element 8 and the ground wire element 9 respectively have one planes; however, the antenna element and the ground wire element may respectively have a plurality of surfaces.

In the present exemplary embodiment, the antenna element 8 and the ground wire element 9 are respectively formed in the rectangular shapes; however, the antenna element and the ground wire element may respectively have slits or meander structures to adjust an electric length.

Further, the present exemplary embodiment shows an example that the antenna is mounted on the straight type terminal; however, even in a terminal in which a casing is divided in to a plurality of parts as in a twofold model or a slide model, the wide band and the high gain at the time of holding the portable wireless device by hand are similarly effectively obtained.

Now, a description will be given to modified examples 1-1 to 1-3 of an arrangement of the antenna element 8 and the ground wire element 9 and modified examples 2-1 to 2-3 in which the antenna element 8 and the ground wire element 9 have a plurality of planes.

Modified Example 1-1

Figure 4:
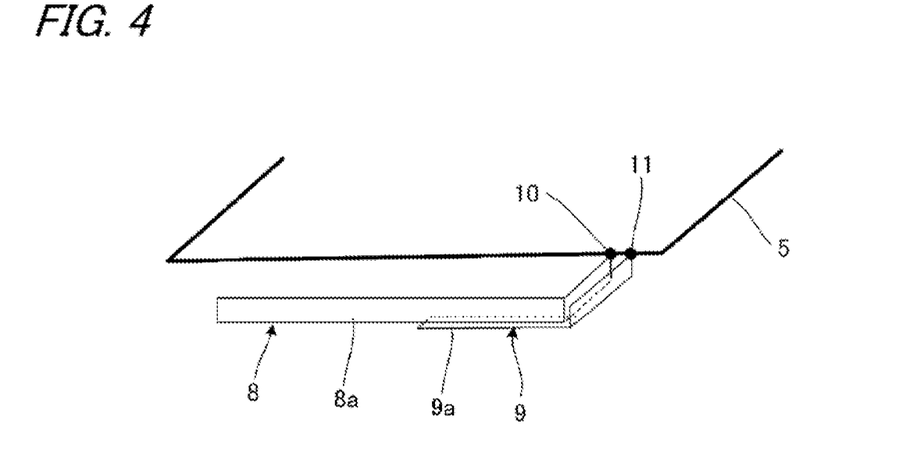
FIG. 4 is a perspective view showing a modified example 1-1 of an arrangement of an antenna element and a ground wire element of the portable wireless device shown in FIG. 1.
Figure 5:
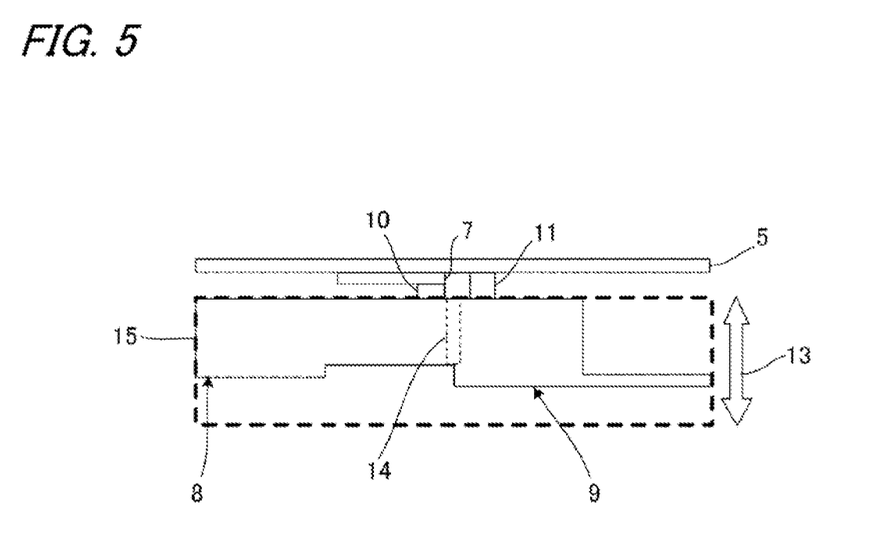
FIG. 5 is a schematic view showing an outline of a positional relation of members respectively in the direction of thickness of the casing of the portable wireless device when the antenna element and the ground wire element have a positional relation shown in FIG. 4.

FIG. 4 is a perspective view showing the modified example 1-1 of the arrangement of the antenna element 8 and the ground wire element 9. As shown in FIG. 4, in the modified example 1-1, the antenna element 8 is arranged so that the antenna radiation part 8a is located substantially vertically to the surface of the casing 2 on which the operating part 4 is provided. The ground wire element 9 is arranged so that the ground wire radiation part 9a is located substantially in parallel with the surface of the casing 2 on which the operating part 4 is provided. FIG. 5 is a schematic view showing an outline of a positional relation of members respectively in the direction of thickness of the casing of the portable wireless device 1 in the arrangement relation shown in FIG. 4. The antenna element 8 and the ground wire element 9 are arranged in such a way as described above. Thus, when the portable wireless device 1 is held by hand, since the ground wire element 9 is arranged between the antenna element 8 and the palm of the hand, interference between the antenna element 8 and the palm of the hand can be more suppressed.

Modified Example 1-2

Figure 6:
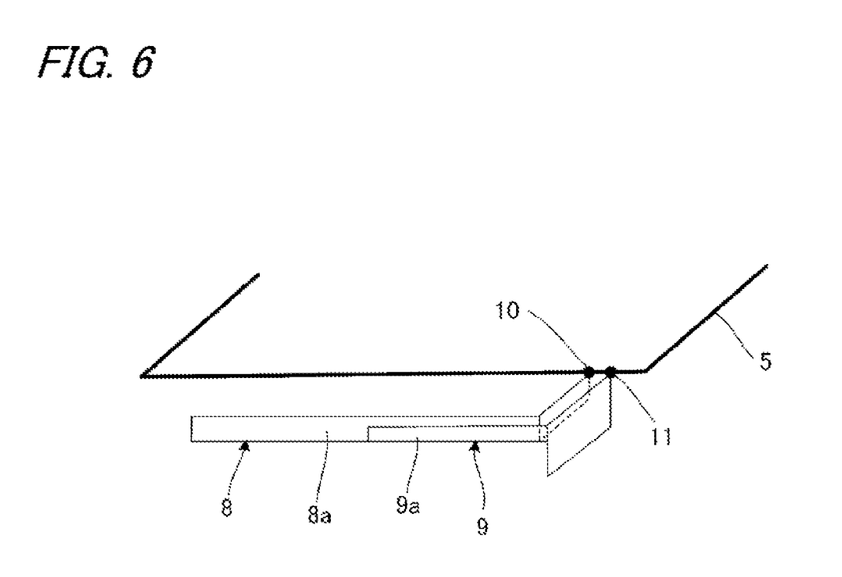
FIG. 6 is a perspective view showing a modified example 1-2 of an arrangement of the antenna element and the ground wire element of the portable wireless device shown in FIG. 1.
Figure 7:
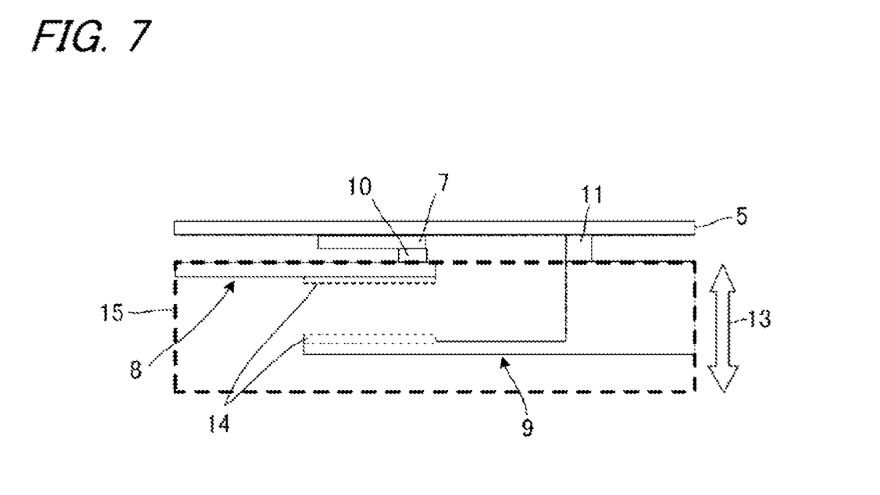
FIG. 7 is a schematic view showing an outline of a positional relation of members respectively in the direction of thickness of the casing of the portable wireless device when the antenna element and the ground wire element have a positional relation shown in FIG. 6.

FIG. 6 is a perspective view showing the modified example 1-2 of the arrangement of the antenna element 8 and the ground wire element 9. As shown in FIG. 6, in the modified example 1-2, the antenna element 8 is arranged so that the antenna radiation part 8a is located substantially vertically to the surface of the casing 2 on which the operating part 4 is provided. The ground wire element 9 is arranged so that the ground wire radiation part 9a is located substantially vertically to the surface of the casing 2 on which the operating part 4 is provided. When the antenna element 8 and the ground wire element 9 are arranged in such a way, the antenna radiation part 8a of the antenna element 8 is parallel to the ground wire radiation part 9a of the ground wire element 9. FIG. 7 is a schematic view showing an outline of a positional relation of members respectively in the direction of thickness of the casing of the portable wireless device 1 in the arrangement relation shown in FIG. 6. When the antenna element 8 and the ground wire element 9 are arranged in such a way, the antenna element 8 is strongly connected to the ground wire element 9. Thus, a deterioration of a gain can be more suppressed when the portable wireless device 1 is held by hand.

Modified Example 1-3

Figure 8:
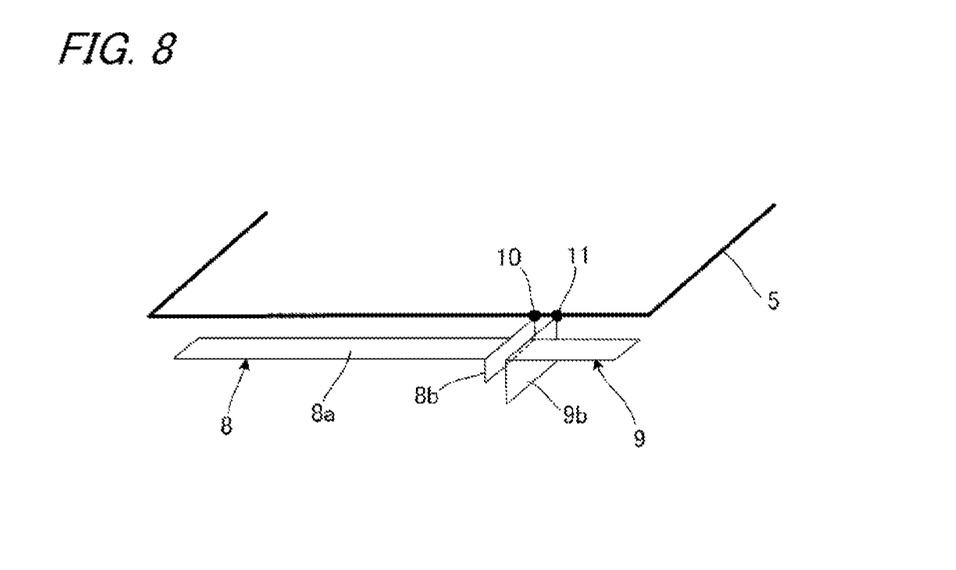
FIG. 8 is a perspective view showing a modified example 1-3 of an arrangement of the antenna element and the ground wire element of the portable wireless device shown in FIG. 1.
Figure 9:
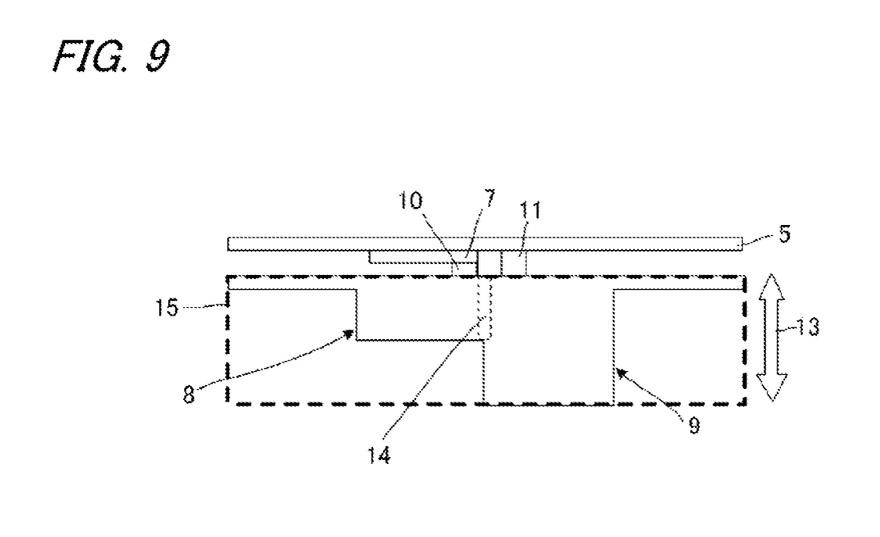
FIG. 9 is a schematic view showing an outline of a positional relation of members respectively in the direction of thickness of the casing of the portable wireless device when the antenna element and the ground wire element have a positional relation shown in FIG. 8.

FIG. 8 is a perspective view showing the modified example 1-3 of the arrangement of the antenna element 8 and the ground wire element 9. As shown in FIG. 8, in the modified example 1-3, the antenna element 8 is arranged so that the antenna radiation part 8*a* is located substantially in parallel with the surface of the casing 2 on which the operating part 4 is provided like the above-described exemplary embodiment. However, the ground wire element 9 is arranged so that the ground terminal connecting part 9*b* is opposed to the feeding terminal connecting part 8*b* of the antenna element 8 (namely, the ground wire terminal 9 is turned in an opposite direction by 180° to the antenna element 8). FIG. 9 is a schematic view showing an outline of a positional relation of members respectively in the direction of thickness of the casing of the portable wireless device 1 in the arrangement relation shown in FIG. 8. When the antenna element 8 and the ground wire element 9 are arranged in such a way, a degree of freedom in an arrangement of the ground wire element 9 is improved, so that a distance between the ground wire element 9 and the palm of the hand can be ensured.

Modified Example 2-1

Figure 10:
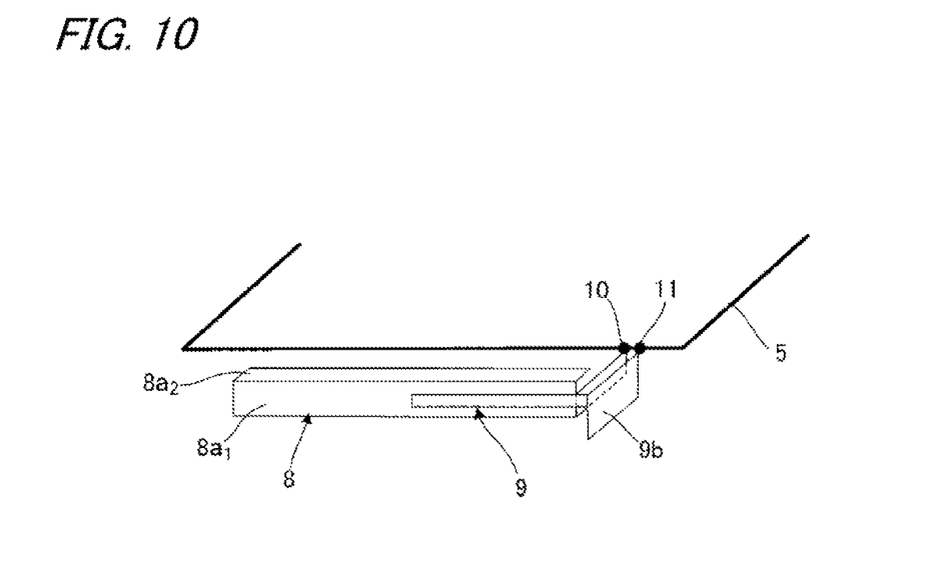
FIG. 10 is a perspective view showing a modified example 2-1 of a form of the antenna element of the portable wireless device shown in FIG. 1.

FIG. 10 is a perspective view showing a modified example 2-1 of a form of the antenna element 8. As shown in FIG. 10, in the modified example 2-1, the antenna element 8 has two planes including a surface 8*a*$_1$ substantially vertical to the surface of the casing 2 on which the operating part 4 is provided and a surface 8*a*$_2$ substantially parallel to the surface of the casing 2. The ground wire element 9 has one plane as in the above-described exemplary embodiment. As described above, since the antenna element 8 has the form having the two planes, a wide band in the first frequency f1 can be obtained. The number of the planes provided in the antenna element 8 is not limited two.

Modified Example 2-2

Figure 11:
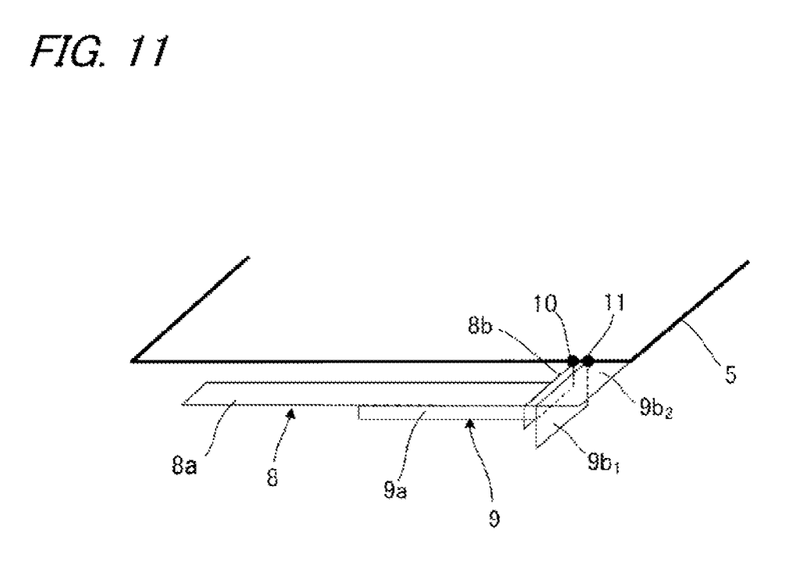
FIG. 11 is a perspective view showing a modified example 2-2 of a form of the ground wire element of the portable wireless device shown in FIG. 1.

FIG. 11 is a perspective view showing a modified example 2-2 of a form of the ground wire element 9. As shown in FIG. 11, in the modified example 2-2, the ground wire element 9 has two planes including a surface 9*b*$_1$ substantially vertical to the surface of the casing 2 on which the operating part 4 is provided and a surface 9*b*$_2$ substantially parallel to the surface of the casing 2. As described above, since the ground wire element 9 has the form having the two planes, a wide band in the second frequency f2 can be obtained. The number of the planes provided in the ground wire element 9 is not limited two.

Modified Example 2-3

Figure 12:
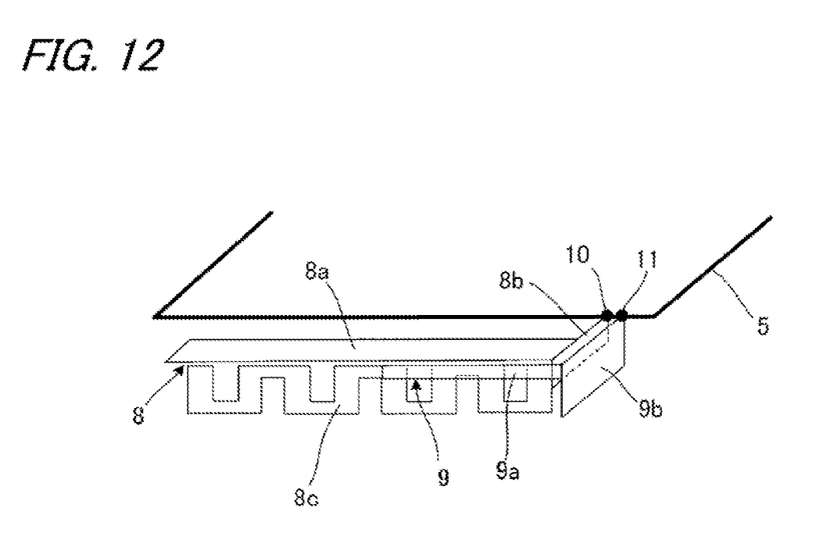
FIG. 12 is a perspective view showing a modified example 2-3 of a form of the antenna element of the portable wireless device shown in FIG. 1.

FIG. 12 is a perspective view showing a modified example 2-3 of a form of the antenna element 8. As shown in FIG. 12, in the modified example 2-3, the antenna element 8 has two radiation parts including a second antenna radiation part 8*c* which is connected to the feeding terminal connecting part 8*b* and resonates by a third frequency f3 in addition to the antenna radiation part 8*a*. As described above, since the antenna element 8 has the form including the two antenna radiation parts, multi-resonance can be more obtained. The number of the antenna radiation parts provided in the antenna element 8 is not limited to two. Further, when the portable wireless device is held by hand, the high gain can be obtained by the third frequency f3 in an arbitrary case.

While the present invention has been described in detail, or with reference to the specific embodiments, it is apparent for those skilled in the art that the invention may be modified and changed in various manners without departing from the scope and spirit of the invention.

The present application is based on Japanese Patent Application No. 2011-040671 filed on Feb. 25, 2011, the entire content of which is incorporated by reference herein.

INDUSTRIAL APPLICABILITY

The present invention effectively makes it possible to compatibly achieve the wide band and the high gain during holding the device by hand in the portable wireless device including the antenna element and the ground wire element, and can be applied to the straight type portable wireless device represented by the smart phone.

DESCRIPTION OF REFERENCE NUMERALS AND SIGNS

1 . . . portable wireless device 2 . . . casing 3 . . . operating and display part 4 . . . operating part 5 . . . circuit board 6 . . . ground 7 . . . radio circuit 8 . . . antenna element 8*a* . . . antenna radiation part 8*b* . . . feeding terminal connecting part 8*c* . . . second antenna radiation part 9 . . . ground wire element 9*a* . . . ground wire radiation part 9*b* . . . ground terminal connecting part 10 . . . feeding terminal 11 . . . ground terminal 13 . . . direction of thickness of casing 14 . . . parallel part 15 . . . antenna mounting area

The invention claimed is:

1. A portable wireless device including:
   a casing;
   an operating part provided on the casing;
   a circuit board provided in the casing and having a ground and a radio circuit;
   an antenna element provided in the casing and arranged so as to be spaced with a prescribed distance from the ground on the circuit board;
   a ground wire element provided in the casing and arranged so as to be spaced with a prescribed distance from the ground on the circuit board;
   a feeding terminal connected to the radio circuit on the circuit board and the antenna element; and
   a ground terminal connected to the ground on the circuit board and the ground wire element, wherein
   the antenna element is configured to resonate by a first frequency,
   the ground wire element is configured to resonate by a second frequency higher than the first frequency,
   the feeding terminal and the ground terminal are close to each other,
   the antenna element and the ground wire element have a parallel part in the vicinity of the feeding terminal and the ground terminal, and
   the ground wire element has a part more separated from the operating part than at least the parallel part of the antenna element and the ground wire element in a direction of thickness of the casing.

2. A portable wireless device according to claim 1, wherein
    a space between the feeding terminal and the ground terminal is as narrow as 0.1λ or shorter at the second frequency.

3. A portable wireless device according to claim 1, wherein
    the antenna element and the ground wire element are formed in the shapes of plates.

4. A portable wireless device according to claim 1, wherein
    the parallel part of the antenna element and the ground wire element is arranged in parallel with the direction of thickness of the casing.

5. A portable wireless device according to claim 1, wherein
    surfaces of the antenna element and the ground wire element substantially intersect at right angles except the parallel part thereof.

6. A portable wireless device according to claim 5, wherein
    the ground wire element is arranged so that a ground wire radiation part thereof is located to be substantially parallel to a surface of the casing on which the operating part is provided.

7. A portable wireless device according to claim 1, wherein
    an antenna radiation part of the antenna element and a ground wire radiation part of the ground wire element are parallel to each other.

8. A portable wireless device according to claim 1, wherein
    the antenna element and the ground wire element are respectively arranged so as to have directions opposite to each other except the parallel part of the antenna element and the ground wire element.

9. A portable wireless device according to claim 1, wherein
    the antenna element is formed to have a plurality of planes.

10. A portable wireless device according to claim 1, wherein
    the ground wire element is formed to have a plurality of planes.

11. A portable wireless device according to claim 1, wherein
    the antenna element is formed to have a plurality of antenna radiation parts.

* * * * *